(12) United States Patent
You et al.

(10) Patent No.: US 12,262,620 B2
(45) Date of Patent: Mar. 25, 2025

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventors: Kuihua You, Hubei (CN); Chen Zhao, Hubei (CN); Feiming Lin, Hubei (CN); Yuan Lin, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,841

(22) PCT Filed: Dec. 20, 2021

(86) PCT No.: PCT/CN2021/139474
§ 371 (c)(1),
(2) Date: Dec. 26, 2021

(87) PCT Pub. No.: WO2023/103065
PCT Pub. Date: Jun. 15, 2023

(65) Prior Publication Data
US 2024/0040903 A1 Feb. 1, 2024

(30) Foreign Application Priority Data
Dec. 9, 2021 (CN) .......................... 202111517345.0

(51) Int. Cl.
*H10K 59/80* (2023.01)
*H04M 1/02* (2006.01)
*H10K 102/00* (2023.01)

(52) U.S. Cl.
CPC ........ *H10K 59/873* (2023.02); *H04M 1/0269* (2022.02); *H10K 2102/311* (2023.02)

(58) Field of Classification Search
CPC ........... H10K 59/873; H10K 2102/311; H10K 77/111; H04M 1/0269; H04M 1/0283; G09F 9/301; G09F 9/33
See application file for complete search history.

(56) References Cited

U.S. PATENT DOCUMENTS

| | | | |
|---|---|---|---|
| 2017/0309843 A1 | 10/2017 | Kim | |
| 2019/0173030 A1* | 6/2019 | Kim | ............... B32B 17/1077 |
| 2020/0176696 A1 | 6/2020 | Dai | |

FOREIGN PATENT DOCUMENTS

| | | | |
|---|---|---|---|
| CN | 106782088 A | 5/2017 | |
| CN | 110649087 A | 1/2020 | |

(Continued)

OTHER PUBLICATIONS

International Search Report in International application No. PCT/CN2021/139474, mailed on Aug. 29, 2022.

(Continued)

*Primary Examiner* — Kyoung Lee
(74) *Attorney, Agent, or Firm* — PV IP PC; Wei Te Chung

(57) ABSTRACT

A display panel and a mobile terminal are provided. The display panel includes a flat area and a curved area. The display panel includes a panel body and a hard support layer that are stacked. The panel body includes a flat portion located in the flat area and a curved portion located in the curved area. The hard support layer includes a first bonding portion provided on one side of the flat portion and a second bonding portion provided on one side of the curved portion. A bending modulus of the second bonding portion is less than a bending modulus of the first bonding portion.

18 Claims, 7 Drawing Sheets

(56) References Cited

FOREIGN PATENT DOCUMENTS

| CN | 112165837 A | 1/2021 |
|----|-------------|--------|
| CN | 112786621 A | 5/2021 |
| CN | 112967606 A | 6/2021 |
| CN | 113674626 A | 11/2021 |
| CN | 113689787 A | 11/2021 |
| WO | 2021209057 A1 | 10/2021 |
| WO | 2021212632 A1 | 10/2021 |

OTHER PUBLICATIONS

Written Opinion of the International Search Authority in International application No. PCT/CN2021/139474, mailed on Aug. 29, 2022.

Chinese Office Action issued in corresponding Chinese Patent Application No. 202111517345.0 dated Jul. 5, 2022, pp. 1-12.

\* cited by examiner

DISPLAY PANEL AND MOBILE TERMINAL

FIELD OF INVENTION

The present application relates to the field of display technologies, and more particularly to a display panel and a mobile terminal.

BACKGROUND OF INVENTION

With the development of display technology, in order to achieve better display performance, increase screen transmittance, and reduce power consumption, a technology that cancels polarizers has been developed on organic light emitting semiconductor (organic light emitting diode, OLED) panels. This technology to cancel the polarizer is called COE (color on thin film encapsulation) technology. Its principle is to add a layer of color filter film on an OLED thin film encapsulation (TFE) layer.

When the COE technology brings a better display performance, since there is no matting effect of the polarizer, defects on a surface of a curved display panel are easier to find. Especially after bending and binding, because outer layer materials such as copper in a super clean foam (SCF) structure are soft, it is prone to deformation after pressing. The imprints produced by the deformation will be displayed on the display panel in an off-screen state. However, when a hard material is used as the outer layer material, the hard material cannot meet bonding requirements of the curved display panel at a curved surface.

Technical Problem

Embodiments of the present application provide a display panel and a mobile terminal to solve the technical problem of achieving a smooth appearance of a curved display panel under a COE technology, while meeting the technical problem of fitting the curved display panel at a curved surface.

SUMMARY OF INVENTION

An embodiment of the present application provides a display panel comprising a flat area and a curved area adjacent to the flat area, wherein the display panel comprises:
  a panel body, wherein the panel body comprises a flat portion located in the flat area and a curved portion located in the curved area, and the curved portion is curved around an axis in an arc shape;
  a hard support layer stacked on the panel body and located on a side away from a light emitting surface of the panel body, wherein the hard support layer comprises a first bonding portion and a second bonding portion;
  wherein the first bonding portion is disposed on one side of the flat portion and located in the flat area, the second bonding portion is disposed on one side of the curved portion, an orthographic projection of the second bonding portion in a direction perpendicular to the flat portion at least covers an orthographic projection of the curved portion in the direction perpendicular to the flat portion, and a bending modulus of the second bonding portion is less than a bending modulus of the first bonding portion.

In the display panel provided by the embodiment of the present application, the second bonding portion is provided with a stress relief structure, such that the bending modulus of the second bonding portion is less than the bending modulus of the first bonding portion.

In the display panel provided by the embodiment of the present application, the stress relief structure comprises a plurality of opening groups arranged on the second bonding portion and arranged along a first direction, each of the opening groups is provided with a plurality of openings arranged along a second direction, a depth of the opening is equal to a thickness of the second bonding portion, the first direction and the second direction form a predetermined angle, and the second direction is parallel to the axis.

In the display panel provided by the embodiment of the present application, in any two adjacent opening groups, each of the openings in one of the opening groups and each of the openings in another of the opening groups are arranged in a staggered manner.

In the display panel provided by the embodiment of the present application, the opening is a long strip extending along the second direction.

In the display panel provided by the embodiment of the present application, the stress relief structure comprises a plurality of strip-shaped grooves opened on the second bonding portion and parallel to each other, a depth of the strip-shaped groove is less than a thickness of the second bonding portion, and an extending direction of the strip-shaped groove is parallel to the axis.

In the display panel provided by the embodiment of the present application, in a direction parallel to the axis, a length of the strip-shaped groove is equal to a length of the second bonding portion.

In the display panel provided by the embodiment of the present application, a groove width of the strip-shaped groove is greater than a distance between any two adjacent strip-shaped grooves.

In the display panel provided by the embodiment of the present application, a plurality of the strip-shaped grooves are opened on a side of the second bonding portion away from the panel body.

In the display panel provided by the embodiment of the present application, the second bonding portion comprises a first sub-portion located in the curved area and a second sub-portion extending from the first sub-portion to the flat area;
  a distance from a side of the second sub-portion away from the first sub-portion to the curved area is less than or equal to a preset threshold.

In the display panel provided by the embodiment of the present application, the curved area comprises a first curved area and a second curved area respectively located on opposite sides of the flat area, the curved portion comprises a first curved portion located in the first curved area and a second curved portion located in the second curved area;
  the second bonding portion comprises a first bonding sub-portion and a second bonding sub-portion, the first bonding sub-portion is arranged on one side of the first curved portion, an orthographic projection of the first bonding sub-portion in the direction perpendicular to the flat portion at least covers an orthographic projection of the first curved portion in the direction perpendicular to the flat portion, the second bonding sub-portion is arranged on one side of the second curved portion, and an orthographic projection of the second bonding sub-portion in the direction perpendicular to the flat portion at least covers an orthographic projection of the second curved portion in the direction perpendicular to the flat portion;
  a bending modulus of the first bonding sub-portion is less than a bending modulus of the first bonding portion, and a bending modulus of the second bonding sub-portion is less than the bending modulus of the first bonding portion.

This application further provides a mobile terminal comprising a display panel and a terminal body, wherein the terminal body and the display panel are combined into one body;

the display panel comprising a flat area and a curved area adjacent to the flat area, the display panel comprising:
a panel body, wherein the panel body comprises a flat portion located in the flat area and a curved portion located in the curved area, and the curved portion is curved around an axis in an arc shape;
a hard support layer stacked on the panel body and located on a side away from a light emitting surface of the panel body, wherein the hard support layer comprises a first bonding portion and a second bonding portion;
wherein the first bonding portion is disposed on one side of the flat portion and located in the flat area, the second bonding portion is disposed on one side of the curved portion, an orthographic projection of the second bonding portion in a direction perpendicular to the flat portion at least covers an orthographic projection of the curved portion in the direction perpendicular to the flat portion, and a bending modulus of the second bonding portion is less than a bending modulus of the first bonding portion.

In the mobile terminal provided in the embodiment of the present application, the second bonding portion is provided with a stress relief structure, such that the bending modulus of the second bonding portion is less than the bending modulus of the first bonding portion.

In the mobile terminal provided in the embodiment of the present application, the stress relief structure comprises a plurality of opening groups arranged on the second bonding portion and arranged along a first direction, each of the opening groups is provided with a plurality of openings arranged along a second direction, a depth of the opening is equal to a thickness of the second bonding portion, the first direction and the second direction form a predetermined angle, and the second direction is parallel to the axis.

In the mobile terminal provided in the embodiment of the present application, in any two adjacent opening groups, each of the openings in one of the opening groups and each of the openings in another of the opening groups are arranged in a staggered manner.

In the mobile terminal provided in the embodiment of the present application, the opening is a long strip extending along the second direction.

In the mobile terminal provided in the embodiment of the present application, the stress relief structure comprises a plurality of strip-shaped grooves opened on the second bonding portion and parallel to each other, a depth of the strip-shaped groove is less than a thickness of the second bonding portion, and an extending direction of the strip-shaped groove is parallel to the axis.

In the mobile terminal provided in the embodiment of the present application, in a direction parallel to the axis, a length of the strip-shaped groove is equal to a length of the second bonding portion.

In the mobile terminal provided in the embodiment of the present application, a groove width of the strip-shaped groove is greater than a distance between any two adjacent strip-shaped grooves.

In the mobile terminal provided in the embodiment of the present application, a plurality of the strip-shaped grooves are opened on a side of the second bonding portion away from the panel body.

Beneficial Effect

The beneficial effect of the present application: by providing a hard support layer on the side of the panel body away from the light emitting surface. In addition, the hard support layer is divided into a first bonding portion that is bonded to the flat portion of the panel body, and a second bonding portion that is bonded to the curved portion of the panel body. The bending modulus of the second bonding portion is set to be less than the bending modulus of the first bonding portion. This not only effectively avoids the problem of print marks on the display panel during pressing, but also realizes a three-dimensional bonding of the hard support layer and the panel body in the curved area.

DESCRIPTION OF DRAWINGS

In order to explain the embodiments or the technical solutions in the prior art more clearly, the following will briefly introduce the drawings that need to be used in the description of the embodiments or the prior art. Obviously, the drawings in the following description are only some embodiments of the invention. For those of ordinary skill in the art, other drawings can be obtained based on these drawings without creative work.

DETAILED DESCRIPTION OF PREFERRED EMBODIMENTS

Figure 1:
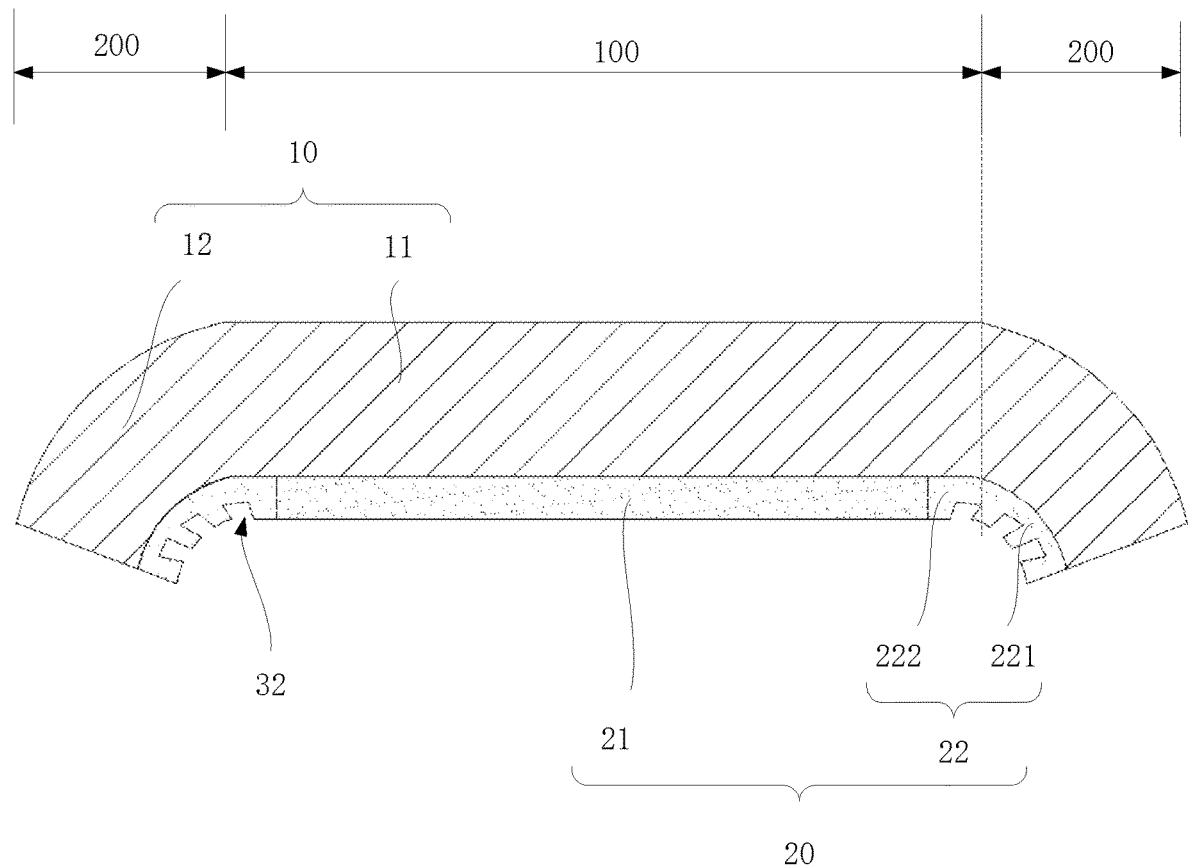
FIG. 1 is a schematic diagram of a first structure of a display panel provided by an embodiment of the application.

The description of the following embodiments refers to the attached drawings to illustrate specific embodiments in which the present invention can be implemented. Directional terms mentioned in the present invention, such as "upper", "lower", "front", "rear", "left", "right", "inner", "outer", "side", etc., are only the directions for referring to the attached drawings. Therefore, the directional terms used are used to describe and understand the present invention, rather than to limit the present invention. In the figure, units with similar structures are indicated by the same reference numerals.

In the description of this application, it should be understood that the terms "first" and "second" are only used for description purposes and cannot be understood as indicating or implying relative importance or implicitly indicating the number of the indicated technical features. Therefore, the features defined with "first" and "second" may explicitly or implicitly include one or more of the features. In the description of the present application, "a plurality of" means two or more than two, unless otherwise specifically defined.

In the description of this application, it should be noted that, unless otherwise clearly defined and limited, the terms "installation", "connection", and "link" should be understood in a broad sense. For example, it can be a fixed connection, a detachable connection, or an integral connection. It can be mechanically connected or electrically connected or can communicate with each other. It can be directly connected or indirectly connected through an intermediary. It can be a communication between two elements or an interaction relationship between two elements. For those of ordinary skill in the art, the specific meanings of the above terms in this application can be understood according to specific circumstances.

The technical solution of the present application will now be described in conjunction with specific embodiments.

Figure 2:
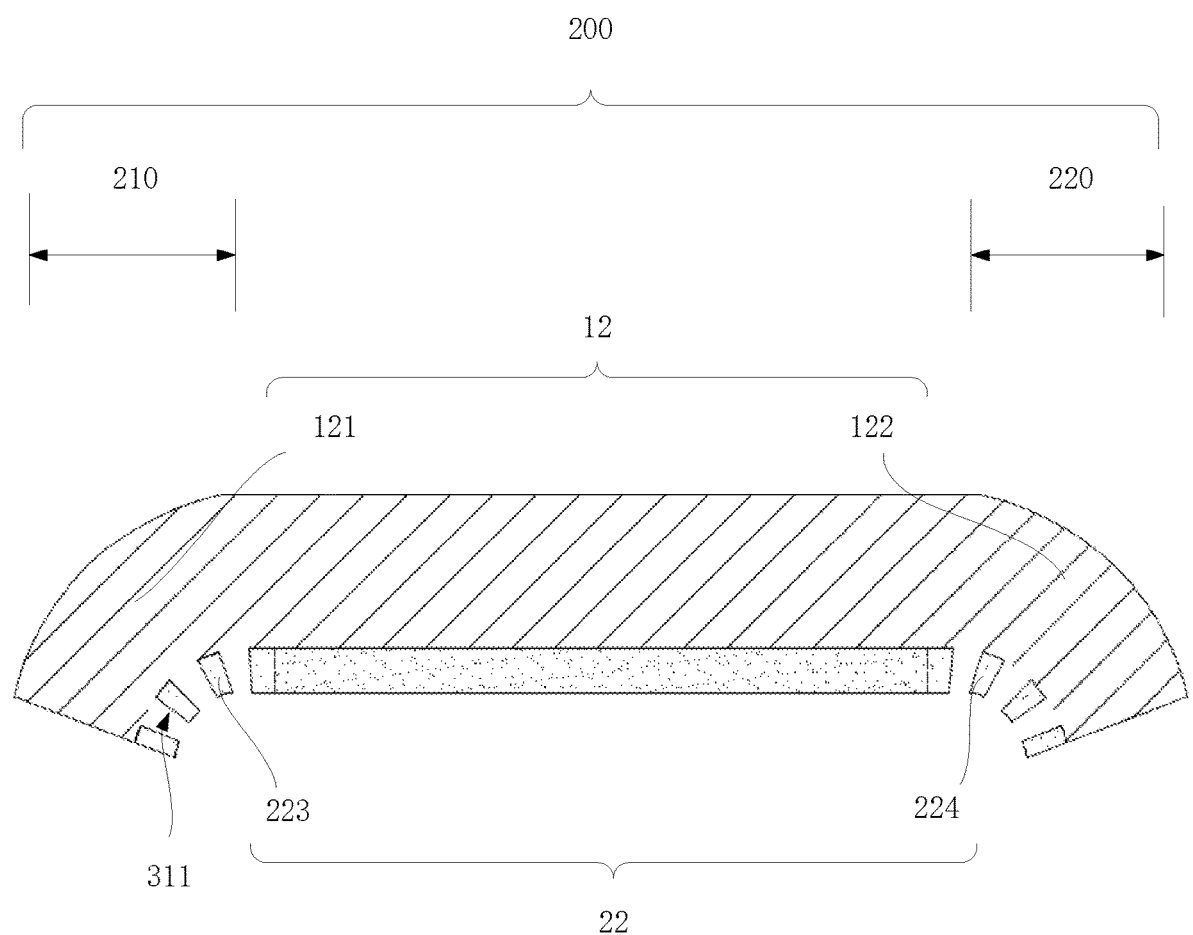
FIG. 2 is a schematic diagram of a second structure of a display panel provided by an embodiment of the application.
Figure 3:
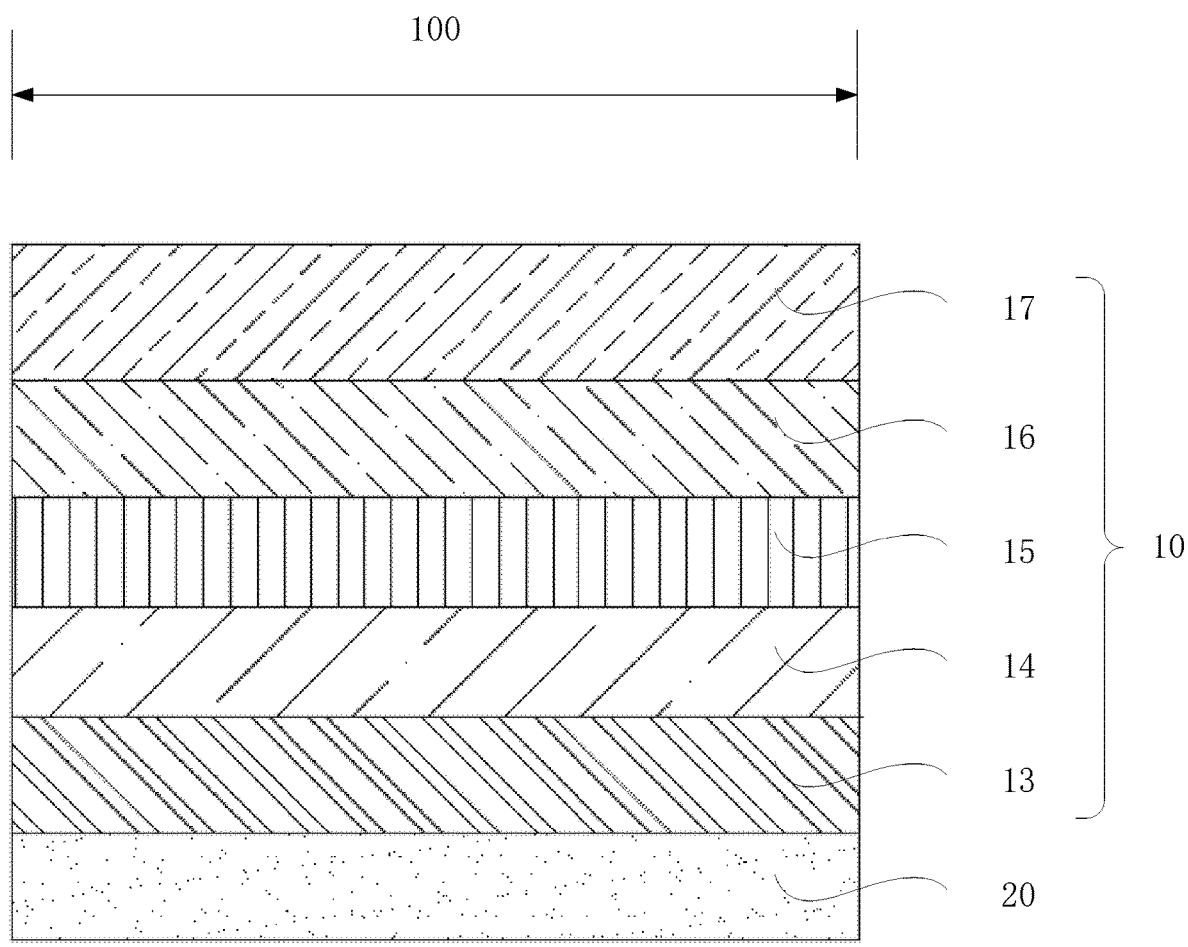
FIG. 3 is a schematic diagram of a film structure in a flat area of a display panel provided by an embodiment of the application.

Referring to FIG. 2 and FIG. 3, an embodiment of the present application provides a driving substrate, which includes a display area 100 and a hub area 200 arranged side by side along a first direction 10.

Referring to FIG. 1 to FIG. 3, an embodiment of the present application provides a display panel comprising a flat area 100 and a curved area 200 adjacent to the flat area 100, wherein the display panel comprises:

a panel body 10, wherein the panel body 10 comprises a flat portion 11 located in the flat area 100 and a curved portion 12 located in the curved area 200, and the curved portion 12 is curved around an axis in an arc shape;

a hard support layer 20 stacked on the panel body 10 and located on a side away from a light emitting surface of the panel body 10, wherein the hard support layer 20 comprises a first bonding portion 21 and a second bonding portion 22;

wherein the first bonding portion 21 is disposed on one side of the flat portion 11 and located in the flat area 100, the second bonding portion 22 is disposed on one side of the curved portion 12, an orthographic projection of the second bonding portion 22 in a direction perpendicular to the flat portion 11 at least covers an orthographic projection of the curved portion 12 in the direction perpendicular to the flat portion 11, and a bending modulus of the second bonding portion 22 is less than a bending modulus of the first bonding portion 21.

It is understandable that, at present, in order to achieve better display effects, increase screen transmittance, and reduce power consumption, a technology that cancels polarizers has been developed on OLED panels. This technology to cancel the polarizer is called COE technology. Its principle is to add a layer of color filter film on the thin film encapsulation layer of the OLED panel. When the COE technology brings a better display effect, since there is no matting effect of the polarizer, the defects on the surface of the curved display panel are easier to find. Especially after bending and binding, because the outer layer materials such as copper in the super clean foam (SCF) structure are soft, it is prone to deformation after pressing. The imprints produced by the deformation will be displayed on the display panel in the off-screen state. However, when a hard material is used as the outer layer material, the hard material cannot meet the fitting requirements of the curved display panel at the curved surface. In this embodiment, a hard support layer 20 is provided on the side of the panel body 10 away from the light-emitting surface. In addition, the hard support layer 20 is divided into a first bonding portion 21 bonded to the flat portion 11 of the panel body 10 and a second bonding portion 22 bonded to the curved portion 12 of the panel body 10, and the bending modulus of the second bonding portion 22 is set to be smaller than the bending modulus of the first bonding portion 21. This not only effectively avoids the problem of print marks on the display panel during pressing, but also realizes the three-dimensional bonding of the hard support layer 20 and the panel body 10 in the curved area 200.

It should be noted that, referring to FIG. 3, in this embodiment, the panel body 10 includes a back plate 13, a display function layer 14, a color filter film layer 15, an optical adhesive layer 16 and a cover plate 17 which are laminated. The hard support layer 20 is stacked on the panel body 10 and is located on a side away from the light emitting surface of the panel body 10. That is, the hard support layer 20 is disposed on the side of the back plate 13 away from the display function layer 14. The hardness of the material of the hard support layer 20 may be greater than 150 HV. When the display panel is subjected to a pressing step such as bending and binding, the hard support layer 20 not only avoids imprints on itself, but also protects the panel body 10. Specifically, the material of the hard support layer 20 may be stainless steel.

It is worth noting that the hard support layer 20 includes a first bonding portion 21 and a second bonding portion 22. The first bonding portion 21 is disposed on one side of the flat portion 11 and located in the flat area 100. Obviously, the first bonding portion 21 is used for bonding the flat area 100 and the flat portion 11. The second bonding portion 22 is provided on one side of the curved portion 12. The orthographic projection of the second bonding portion 22 in the direction perpendicular to the flat portion 11 at least covers the orthographic projection of the curved portion 12 in the direction perpendicular to the flat portion 11. That is, the second bonding portion 22 is used to bond with the curved portion 12 at least. By setting the bending modulus of the second bonding portion 22 to be smaller than the bending modulus of the first bonding portion 21 and by reducing the bending modulus of the second bonding portion 22, the second bonding portion 22 can better fit the curved portion 12 along the curved surface of the curved portion 12. In this embodiment, under the condition of ensuring the hardness of the first bonding portion 21 and the second bonding portion 22, the structure or material of the second bonding portion 22 can be changed. This makes the bending modulus of the second bonding portion 22 smaller than the bending modulus of the first bonding portion 21. Specifically, the bending modulus of the second bonding portion 22 is less than 100 Gpa.

In one embodiment, referring to FIG. 1 and FIG. 2, the second bonding portion 22 is provided with a stress relief structure, so that the bending modulus of the second bonding portion 22 is less than the bending modulus of the first bonding portion 21.

It can be understood that the second bonding portion 22 is provided with a stress relief structure to reduce the bending modulus of the second bonding portion 22. Therefore, the bending modulus of the second bonding portion 22 is less than the bending modulus of the first bonding portion 21 to meet the three-dimensional bonding requirements of the panel body 10 in the curved area 200.

Figure 6:
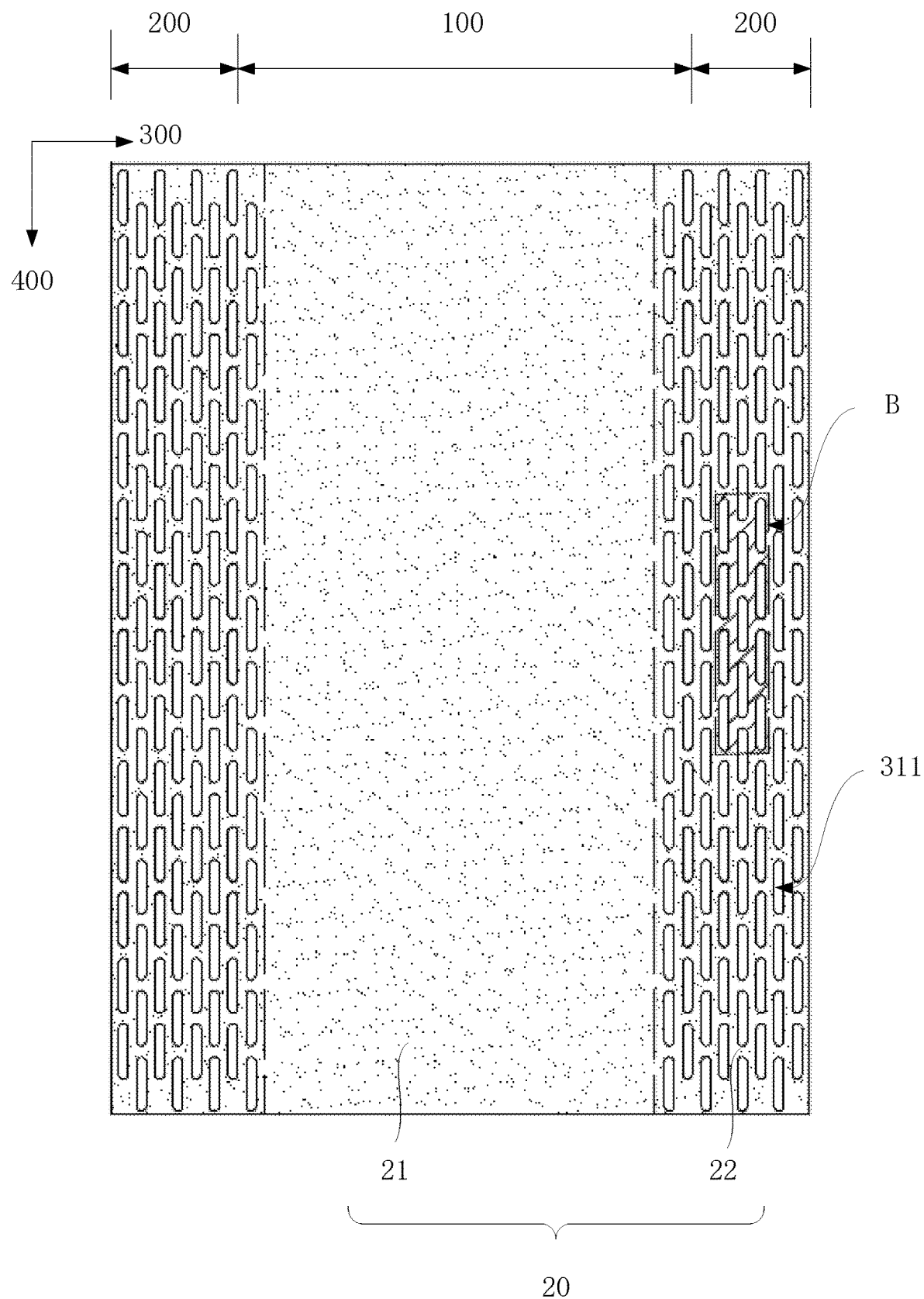
FIG. 6 is a schematic diagram of a second structure of a hard support layer in a display panel provided by an embodiment of the application.
Figure 7:
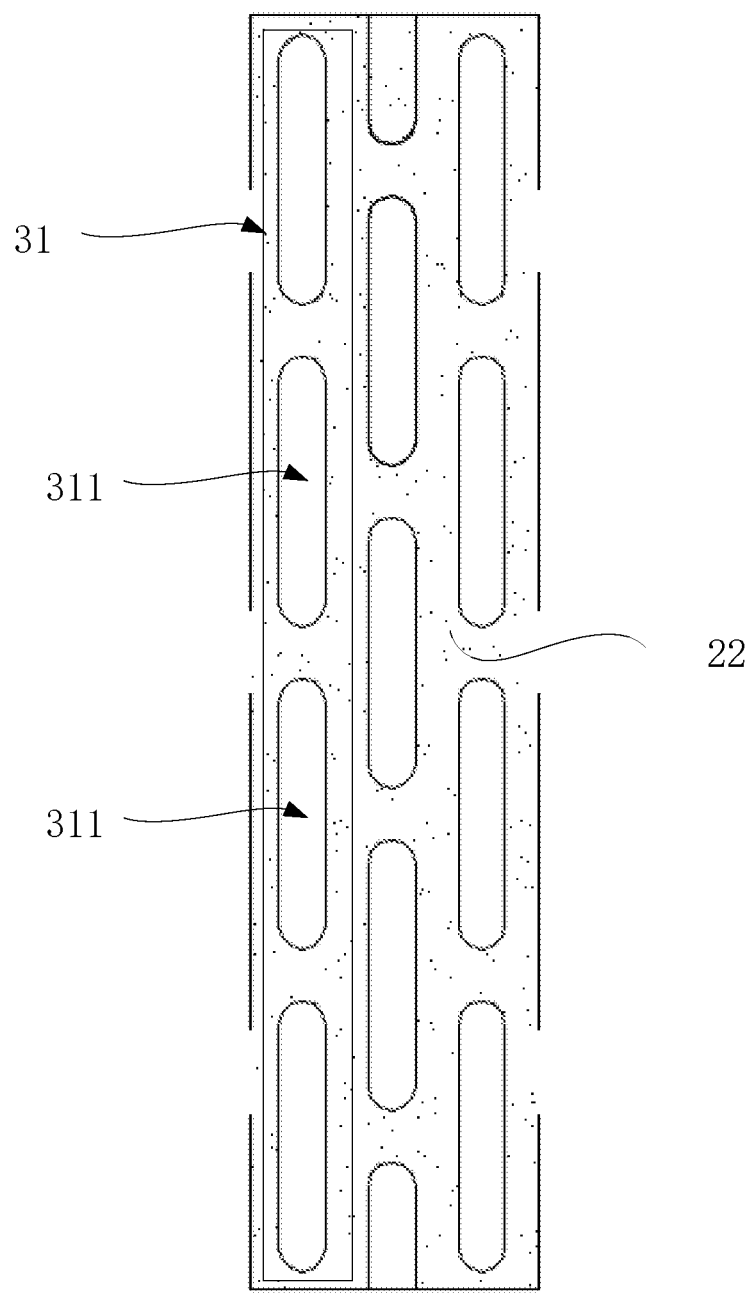
FIG. 7 is a schematic diagram of an enlarged structure of FIG. 6 at B.

In one embodiment, referring to FIG. 6 and FIG. 7, the stress relief structure includes a plurality of opening groups 31 arranged on the second bonding portion 22 and arranged along a first direction 300. Each of the opening groups 31 is provided with a plurality of openings 311 arranged along a second direction 400. The depth of the opening 311 is equal to the thickness of the second bonding portion 22. The first direction 300 and the second direction 400 form a predetermined angle, and the second direction 400 is parallel to the axis.

It can be understood that the stress relief structure is provided as a plurality of opening groups 31 located on the second bonding portion 22 and arranged along the first direction 300. Each of the opening groups 31 is provided with a plurality of openings 311 arranged along the second direction 400. The depth of the opening 311 is equal to the thickness of the second bonding portion 22. That is, the opening 311 penetrates the second bonding portion 22, and the second direction 400 is parallel to the axis. This reduces the bending modulus of the second bonding portion 22 bending around the axis, so that the second bonding portion 22 is bent along the axis. This enables the second bonding portion 22 and the curved portion 12 to closely fit. The first direction 300 and the second direction 400 form a predetermined angle. Specifically, the first direction 300 is perpendicular to the second direction 400.

In this embodiment, referring to FIG. 6 and FIG. 7, in any two adjacent opening groups 31, each of the openings 311 in one of the opening groups 31 and each of the openings in another of the opening groups 31 are arranged staggered. It can be understood that in two adjacent opening groups 31, each of the openings 311 in one of the opening groups 31 and each of the openings 311 in another of the opening groups 31 are arranged in a staggered manner. When the bending modulus of the second bonding portion 22 is reduced, the uniform support of the second bonding portion 22 to the curved portion 12 is ensured. Specifically, the opening 311 has an elongated shape extending along the second direction 400. Obviously, the opening 311 is a long strip extending along the second direction 400. That is, the long side of the opening 311 is parallel to the extending direction of the axis. Thereby, the bending modulus when the second bonding portion 22 is bent around the axis is better reduced, and the second bonding portion 22 is closely attached to the bending portion 12.

In this embodiment, referring to FIG. 6 and FIG. 7, the distance between two adjacent opening groups 31 is 0.1 mm to 1 mm. In one opening group 31, the distance between any two adjacent openings 311 is 0.1 mm to 1.5 mm. Specifically, both ends of the opening 311 are arc-shaped. The width of the arc in the first direction 300 is 0.1 mm to 1 mm. The width of the arc in the second direction 400 is 0.05 mm to 0.5 mm.

Figure 4:
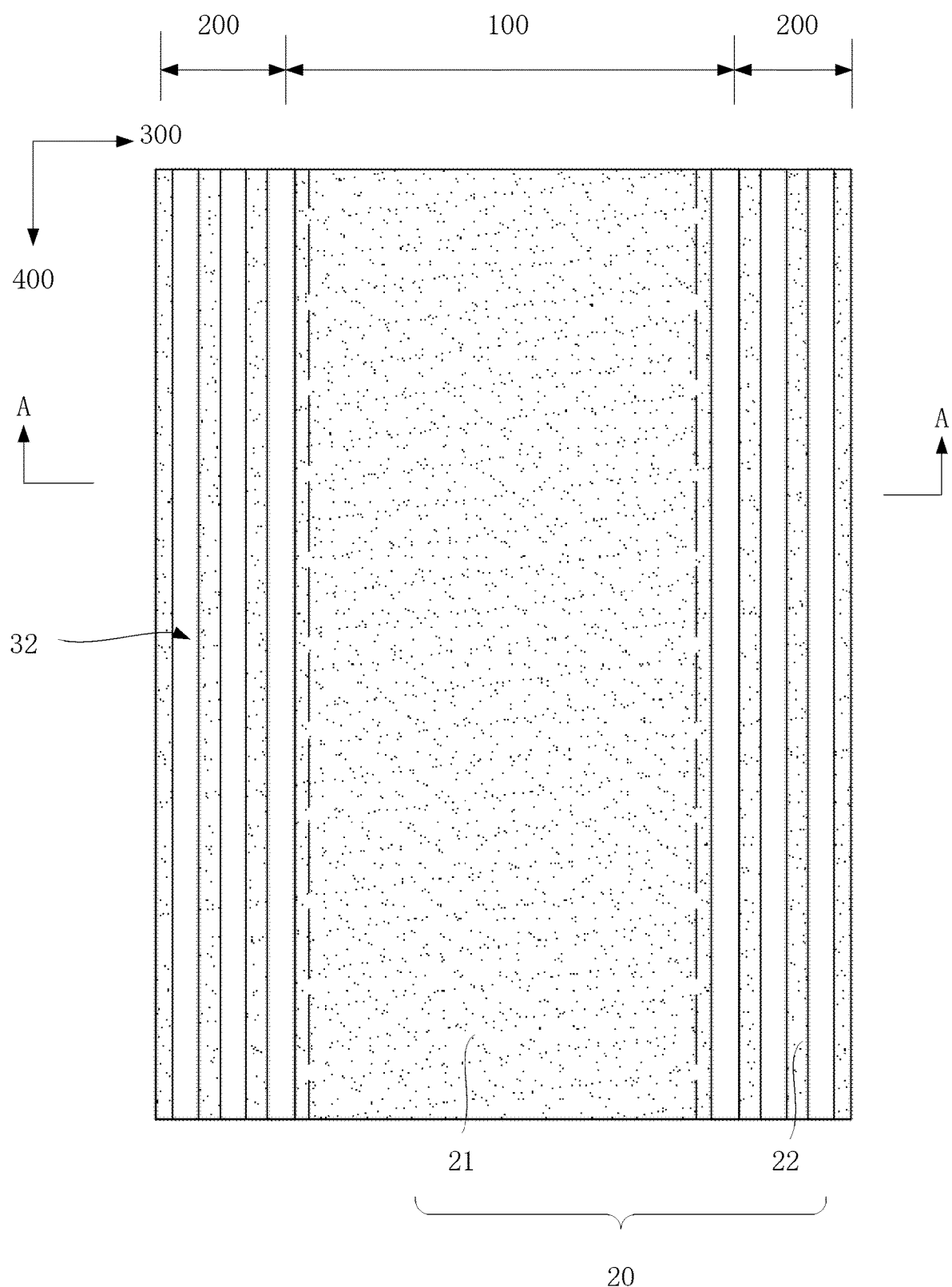
FIG. 4 is a schematic diagram of a first structure of a hard support layer in a display panel provided by an embodiment of the application.
Figure 5:
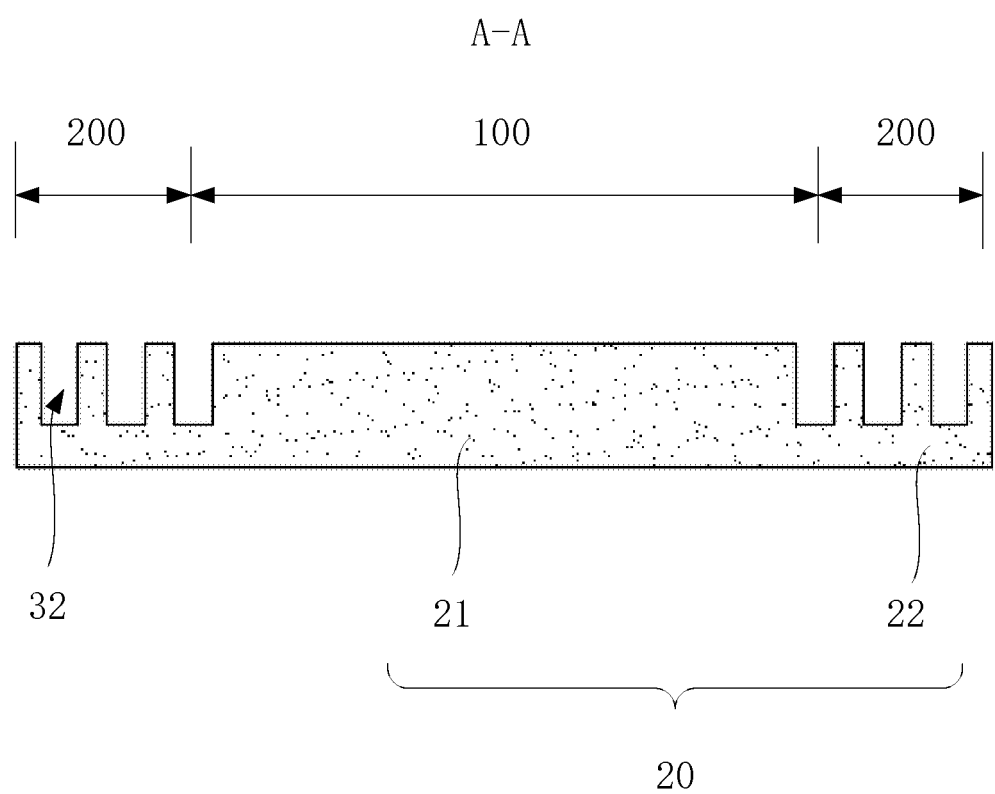
FIG. 5 is a schematic cross-sectional structure diagram of FIG. 4 at A-A.

In one embodiment, referring to FIG. 4 and FIG. 5, the stress relief structure includes a plurality of strip-shaped grooves 32 opened on the second bonding portion 22 and parallel to each other. The depth of the strip-shaped groove 32 is smaller than the thickness of the second bonding portion 22, and the extending direction of the strip-shaped groove 32 is parallel to the axis.

It can be understood that the stress relief structure includes a plurality of strip-shaped grooves 32 opened on the second bonding portion 22 and parallel to each other. The depth of the strip groove 32 is set to be smaller than the thickness of the second bonding portion 22. In combination, the extending direction of the strip-shaped groove 32 is set in a structure parallel to the axis. This reduces the bending modulus of the second bonding portion 22. This makes it possible to release the bending stress of the second bonding portion 22 at the position of the strip-shaped groove 32 during the bonding process of the second bonding portion 22 and the curved portion 12. This makes the second bonding portion 22 easier to fit on the curved portion 12.

In this embodiment, referring to FIG. 4 and FIG. 5, in a direction parallel to the axis, the length of the strip groove 32 is equal to the length of the second bonding portion 22. It can be understood that the length of the strip-shaped groove 32 is set to be equal to the length of the second bonding portion 22. That is, in a direction parallel to the axis, the strip-shaped groove 32 penetrates the second bonding portion 22. During the bonding process of the second bonding portion 22 and the curved portion 12, the position of the strip-shaped groove 32 can better release the bending stress of the second bonding portion 22.

In this embodiment, referring to FIG. 1, FIG. 4 and FIG. 5, a plurality of the strip-shaped grooves 32 are opened on the side of the second bonding portion 22 away from the panel body 10. It can be understood that the strip groove 32 is opened on the side of the second bonding portion 22 away from the panel body 10. That is, the strip-shaped groove 32 is located on the inner surface of the second bonding portion 22 when it is bent. During the bonding process of the second bonding portion 22 and the curved portion 12, the inner surface of the second bonding portion 22 will generate compressive stress. By avoiding the position of the strip-shaped groove 32 to release the bending stress of the second bonding portion 22, the bending modulus of the second bonding portion 22 is better reduced. This ensures that the second bonding portion 22 and the curved portion 12 closely fit. Specifically, the groove width of the strip-shaped groove 32 is greater than the distance between any two adjacent strip-shaped grooves 32. Obviously, by setting the width of the strip-shaped groove 32 to be greater than the distance between any two adjacent strip-shaped grooves 32. That is, the groove width of the strip-shaped groove 32 is increased. This makes it possible to better release the bending stress of the second bonding portion 22 at the position of the strip-shaped groove 32. In this embodiment, the width of the strip-shaped groove 32 may be 0.1 mm to 1 mm. The distance between any two adjacent strip grooves 32 may be 0.1 mm to 1 mm. In addition, the depth of the strip-shaped groove 32 is 20% to 80% of the depth of the second bonding portion 22.

In one embodiment, referring to FIG. 1 and FIG. 2, the second bonding portion 22 includes a first sub-portion 221 located in the curved area 200 and a second sub-portion 222 extending from the first sub-portion 221 to the flat area 100.

The distance from the side of the second sub-portion 222 away from the first sub-portion 221 to the curved area 200 is less than or equal to a preset threshold.

It is understandable that, the second bonding portion 22 is configured to include a first sub-portion 221 located in the curved area 200 and a second sub-portion 222 extending from the first sub-portion 221 to the flat area 100. That is, the second bonding portion 22 is extended into the flat area 100. This avoids that when the second bonding portion 22 is bonded to the curved portion 12, tensile stress will be generated on the outer side of the second bonding portion 22 when it is bent. This causes part of the first bonding portion 21 to be stretched into the curved area 200. This affects the bonding effect of the hard support layer 20 and the panel body 10 in the curved area 200. The second bonding portion 22 is configured to further include a second sub-portion 222 extending into the flat area 100. This prevents the first bonding portion 21 from affecting the bonding effect of the hard support layer 20 and the panel body 10 in the curved area 200. In this embodiment, the distance from a side of the second sub-portion 222 away from the first sub-portion 221 to the curved area 200 is less than or equal to a preset threshold. The preset threshold may be greater than or equal to 0.1 mm. Specifically, the first sub-portion 221 and the second sub-portion 222 may both be provided with the stress relief structure, which will not be repeated here.

In one embodiment, referring to FIG. 1 and FIG. 2, the curved area 200 includes a first curved area 210 and a second curved area 220 respectively located on opposite sides of the flat area 100. The curved portion 12 includes a first curved portion 121 located in the first curved area 210 and a second curved portion 122 located in the second curved area 220.

The second bonding portion 22 includes a first bonding sub-portion 223 and a second bonding sub-portion 224. The first bonding sub-portion 223 is disposed on one side of the first curved portion 121. The orthographic projection of the first bonding sub-portion 223 in the direction perpendicular to the flat portion 11 at least covers the orthographic projection of the first curved portion 121 in the direction perpendicular to the flat portion 11. The second bonding sub-portion 224 is disposed on one side of the second curved portion 122. The orthographic projection of the second bonding sub-portion 224 in the direction perpendicular to the flat portion 11 at least covers the orthographic projection of the second curved portion 122 in the direction perpendicular to the flat portion 11.

The bending modulus of the first bonding sub-portion 223 is smaller than the bending modulus of the first bonding portion 21. The bending modulus of the second bonding sub-portion 224 is smaller than the bending modulus of the first bonding portion 21.

The present application also provides a mobile terminal including the display panel and the terminal body as described in the previous embodiment, and the terminal body and the display panel are combined into one body.

In this application, a hard support layer 20 is provided on the side of the panel body 10 away from the light emitting surface. In addition, the hard support layer 20 is divided into a first bonding portion 21 bonded to the flat portion 11 of the panel body 10, and a second bonding portion 22 bonded to the curved portion 12 of the panel body 10. The bending modulus of the second bonding portion 22 is set to be smaller than the bending modulus of the first bonding portion 21. This not only effectively avoids the problem of print marks on the display panel during pressing. This also realizes the three-dimensional bonding of the hard support layer 20 and the panel body 10 in the curved area 200.

In summary, although the present invention has been disclosed in a preferred embodiment as above. However, the above-mentioned preferred embodiments are not intended to limit the present invention. Those of ordinary skill in the art can make various changes and modifications without departing from the spirit and scope of the present invention. Therefore, the protection scope of the present invention is subject to the scope defined by the claims.

What is claimed is:

1. A display panel, comprising:
a flat area and a curved area adjacent to the flat area, the display panel comprising:
a panel body, wherein the panel body comprises a flat portion located in the flat area and a curved portion located in the curved area, and the curved portion is curved around an axis in an arc shape;
a hard support layer stacked on the panel body and located on a side away from a light emitting surface of the panel body, wherein the hard support layer comprises a first bonding portion and a second bonding portion;
wherein the first bonding portion is disposed on one side of the flat portion and located in the flat area, the second bonding portion is disposed on one side of the curved portion, an orthographic projection of the second bonding portion in a direction perpendicular to the flat portion at least covers an orthographic projection of the curved portion in the direction perpendicular to the flat portion, and the second bonding portion is provided with a stress relief structure, such that a bending modulus of the second bonding portion is less than a bending modulus of the first bonding portion.

2. The display panel according to claim 1, wherein
the stress relief structure comprises a plurality of opening groups arranged on the second bonding portion and arranged along a first direction, each of the opening groups is provided with a plurality of openings arranged along a second direction, a depth of the opening is equal to a thickness of the second bonding portion, the first direction and the second direction form a predetermined angle, and the second direction is parallel to the axis.

3. The display panel according to claim 2, wherein
in any two adjacent opening groups, each of the openings in one of the opening groups and each of the openings in another of the opening groups are arranged in a staggered manner.

4. The display panel according to claim 2, wherein
the opening is a long strip extending along the second direction.

5. The display panel according to claim 1, wherein
the stress relief structure comprises a plurality of strip-shaped grooves opened on the second bonding portion and parallel to each other, a depth of the strip-shaped groove is less than a thickness of the second bonding portion, and an extending direction of the strip-shaped groove is parallel to the axis.

6. The display panel according to claim 5, wherein
in a direction parallel to the axis, a length of the strip-shaped groove is equal to a length of the second bonding portion.

7. The display panel according to claim 5, wherein
a groove width of the strip-shaped groove is greater than a distance between any two adjacent strip-shaped grooves.

8. The display panel according to claim 5, wherein
a plurality of the strip-shaped grooves are opened on a side of the second bonding portion away from the panel body.

9. The display panel according to claim 1, wherein
the second bonding portion comprises a first sub-portion located in the curved area and a second sub-portion extending from the first sub-portion to the flat area;
a distance from a side of the second sub-portion away from the first sub-portion to the curved area is less than or equal to a preset threshold.

10. The display panel according to claim 1, wherein
the curved area comprises a first curved area and a second curved area respectively located on opposite sides of the flat area, the curved portion comprises a first curved portion located in the first curved area and a second curved portion located in the second curved area;
the second bonding portion comprises a first bonding sub-portion and a second bonding sub-portion, the first bonding sub-portion is arranged on one side of the first curved portion, an orthographic projection of the first bonding sub-portion in the direction perpendicular to the flat portion at least covers an orthographic projection of the first curved portion in the direction perpendicular to the flat portion, the second bonding sub-portion is arranged on one side of the second curved portion, and an orthographic projection of the second bonding sub-portion in the direction perpendicular to the flat portion at least covers an orthographic projection of the second curved portion in the direction perpendicular to the flat portion;

a bending modulus of the first bonding sub-portion is less than a bending modulus of the first bonding portion, and a bending modulus of the second bonding sub-portion is less than the bending modulus of the first bonding portion.

11. A mobile terminal comprising:

a display panel and a terminal body, wherein the terminal body and the display panel are combined into one body;

the display panel comprising a flat area and a curved area adjacent to the flat area, the display panel comprising:

a panel body, wherein the panel body comprises a flat portion located in the flat area and a curved portion located in the curved area, and the curved portion is curved around an axis in an arc shape;

a hard support layer stacked on the panel body and located on a side away from a light emitting surface of the panel body, wherein the hard support layer comprises a first bonding portion and a second bonding portion;

wherein the first bonding portion is disposed on one side of the flat portion and located in the flat area, the second bonding portion is disposed on one side of the curved portion, an orthographic projection of the second bonding portion in a direction perpendicular to the flat portion at least covers an orthographic projection of the curved portion in the direction perpendicular to the flat portion, and the second bonding portion is provided with a stress relief structure, such that a bending modulus of the second bonding portion is less than a bending modulus of the first bonding portion.

12. The mobile terminal according to claim 11, wherein the stress relief structure comprises a plurality of opening groups arranged on the second bonding portion and arranged along a first direction, each of the opening groups is provided with a plurality of openings arranged along a second direction, a depth of the opening is equal to a thickness of the second bonding portion, the first direction and the second direction form a predetermined angle, and the second direction is parallel to the axis.

13. The mobile terminal according to claim 12, wherein in any two adjacent opening groups, each of the openings in one of the opening groups and each of the openings in another of the opening groups are arranged in a staggered manner.

14. The mobile terminal according to claim 12, wherein the opening is a long strip extending along the second direction.

15. The mobile terminal according to claim 12, wherein the stress relief structure comprises a plurality of strip-shaped grooves opened on the second bonding portion and parallel to each other, a depth of the strip-shaped groove is less than a thickness of the second bonding portion, and an extending direction of the strip-shaped groove is parallel to the axis.

16. The mobile terminal according to claim 15, wherein in a direction parallel to the axis, a length of the strip-shaped groove is equal to a length of the second bonding portion.

17. The mobile terminal according to claim 15, wherein a groove width of the strip-shaped groove is greater than a distance between any two adjacent strip-shaped grooves.

18. The mobile terminal according to claim 15, wherein a plurality of the strip-shaped grooves are opened on a side of the second bonding portion away from the panel body.

\* \* \* \* \*